United States Patent
Lee

(10) Patent No.: US 11,373,711 B2
(45) Date of Patent: Jun. 28, 2022

(54) ADDRESS COUNTING CIRCUIT AND SEMICONDUCTOR DEVICE INCLUDING THE ADDRESS COUNTING CIRCUIT

(71) Applicant: SK hynix Inc., Icheon-si (KR)

(72) Inventor: Wan Seob Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/983,874

(22) Filed: Aug. 3, 2020

(65) Prior Publication Data
US 2021/0335430 A1 Oct. 28, 2021

(30) Foreign Application Priority Data
Apr. 28, 2020 (KR) .......................... 10-2020-0051450

(51) Int. Cl.
*G11C 16/04* (2006.01)
*G11C 16/32* (2006.01)

(52) U.S. Cl.
CPC .......... *G11C 16/32* (2013.01); *G11C 16/0483* (2013.01)

(58) Field of Classification Search
CPC ....... G11C 16/32; G11C 16/0483; G11C 8/04; G11C 8/16; G11C 8/18; G11C 13/0023
USPC ...................................................... 365/185.17
See application file for complete search history.

(56) References Cited

U.S. PATENT DOCUMENTS

| | | | | |
|---|---|---|---|---|
| 6,728,162 B2 * | 4/2004 | Lee | ...................... | G11C 7/1078 365/219 |
| 7,287,143 B2 * | 10/2007 | Lee | ...................... | G11C 7/22 711/167 |
| 9,552,857 B1 | 1/2017 | Chae | | |
| 9,601,172 B2 * | 3/2017 | Lee | ...................... | G11C 8/06 |

* cited by examiner

*Primary Examiner* — Tha-O H Bui
(74) *Attorney, Agent, or Firm* — William Park & Associates Ltd.

(57) ABSTRACT

An address counting circuit includes a shared address counting circuit configured to generate a first shared address and a second shared address by counting an external start address at a first edge and a second edge of a counting clock signal and a latch circuit including a plurality of latches configured to share the first shared address and the second shared address, respectively and generate a plurality of column addresses by latching the first shared address and second shared address according to a plurality of latch clock signals.

20 Claims, 6 Drawing Sheets

ADDRESS COUNTING CIRCUIT AND SEMICONDUCTOR DEVICE INCLUDING THE ADDRESS COUNTING CIRCUIT

CROSS-REFERENCES TO RELATED APPLICATION

The present application claims priority under 35 U.S.C. § 119(a) to Korean application number 10-2020-0051450, filed on Apr. 28, 2020, in the Korean Intellectual Property Office, which is incorporated herein by reference in its entirety.

BACKGROUND

1. Technical Field

Various embodiments may generally relate to a semiconductor circuit, and more particularly, to an address counting circuit and a semiconductor device including the address counting circuit.

2. Related Art

A semiconductor device may divide an entire memory region into a plurality of unit memory regions, for example, a plurality of memory banks and control the plurality of unit memory regions.

A semiconductor device, for example, a nonvolatile memory device may perform data input and output on the plurality of memory banks by sequentially increasing column addresses of the plurality of memory banks.

The semiconductor device may inevitably include an address counting circuit configured to increase the column address. The performance of the semiconductor device may be improved through improvement in a design scheme of the address counting circuit.

SUMMARY

In an embodiment of the present disclosure, an address counting circuit may include: a shared address counting circuit configured to generate a first shared address and a second shared address by counting an external start address at a first edge and a second edge of a counting clock signal; and a latch circuit including a plurality of latches configured to share the first shared address and the second shared address, respectively and generate a plurality of column addresses by latching the first shared address and the second shared address according to a plurality of latch clock signals.

In an embodiment of the present disclosure, a semiconductor device may include: a memory region including a plurality of unit memory regions; and an address counting circuit configured to generate a first shared address and a second shared address by counting an external start address at a first edge and a second edge of a counting clock signal and generate a plurality of column addresses corresponding to the plurality of unit memory regions by latching the first shared address and the second shared address according to a plurality of latch clock signals.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present teachings are described in detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments of the present teachings. However, embodiments of the present teachings should not be construed as limiting the present teachings. Although a few embodiments of the present teachings are shown and described, it will be appreciated by those of ordinary skill in the art that changes may be made in these embodiments without departing from the principles and spirit of the present teachings.

Embodiments are provided to an address counting circuit that may be capable of efficiently controlling an address and reducing a circuit area and a semiconductor device including the address counting circuit.

Figure 1:
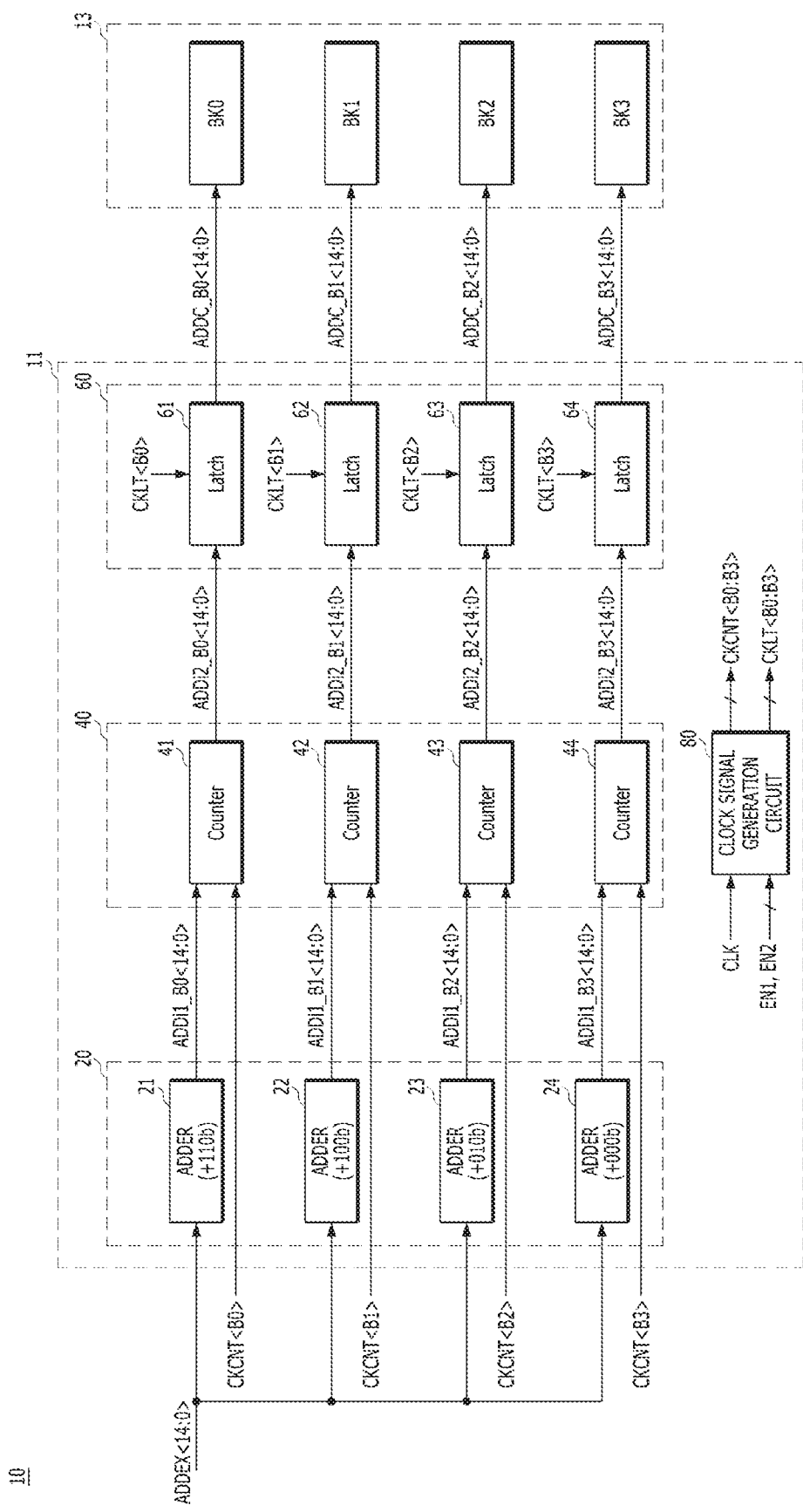
FIG. 1 is a diagram illustrating a configuration of a semiconductor device according to an embodiment of the present disclosure.

FIG. 1 is a diagram illustrating a configuration of a semiconductor device according to an embodiment.

Referring to FIG. 1, a semiconductor device 10 according to an embodiment may include an address counting circuit 11 and a memory region 13.

The memory region 13 may include a plurality of unit memory regions, for example, a plurality of memory banks BK0, BK1, BK2, and BK3.

Each of the plurality of memory banks BK0 to BK3 may include dynamic random access memory (DRAM) cells or NAND flash memory cells.

The address counting circuit 11 may generate a plurality of first preliminary column addresses ADDi1<B0:B3><14:0> by adding a plurality of weights having different values from each other to a start address (hereinafter, referred to as external start address) ADDEX<14:0> provided from the outside of the semiconductor device 10 and generate a plurality of column addresses ADDC<B0:B3><14:0> by counting the plurality of first preliminary column addresses ADDi1<B0:B3><14:0> according to a plurality of counting clock signals CKCNT<B0:B3>.

The address counting circuit 11 may generate a plurality of second preliminary column addresses ADDi2<B0:B3><14:0> by counting the plurality of first preliminary column addresses ADDi1<B0:B3><14:0> according to the plurality of counting clock signals CKCNT<B0:B3> and generate the plurality of column addresses ADDC<B0:B3><14:0> by latching the plurality of second preliminary column addresses ADDi2<B0:B3><14:0> according to a plurality of latch clock signals CKLT<B0:B3>.

The example that the memory region 13 is configured of four memory banks and the address counting circuit 11 is also configured to generate the column addresses corresponding to the four memory banks has been illustrated in an embodiment, but the configuration of the address counting circuit 11 may also be changed according to the change in the configuration of the memory region 13.

The address counting circuit 11 may include an address adjuster 20 and a counting circuit 40.

The address counting circuit 11 may further include a latch circuit 60 and a clock signal generation circuit 80.

The address adjuster 20 may generate the plurality of first preliminary column addresses ADDi1<B0:B3><14:0> by adding the plurality of weights having the different values from each other to the external start address ADDEX<14:0>.

The address adjuster 20 may generate the plurality of first preliminary column addresses ADDi1<B0:B3><14:0> by adding the plurality of weights having the different values from each other to bits<2:0> of the external start address ADDEX<14:0>.

The address adjuster 20 may include a plurality of adders 21 to 24.

A first adder 21 may generate the first preliminary column address ADDi1<B0><14:0> by adding a weight 110b to the external start address ADDEX<14:0>.

The first adder 21 may generate the first preliminary column address ADDi1<B0><14:0> by adding the weight 110b to the bits<2:0> of the external start address ADDEX<14:0>.

A second adder 22 may generate the first preliminary column address ADDi1<B1><14:0> by adding a weight 100b to the external start address ADDEX<14:0>.

The second adder 22 may generate the first preliminary column address ADDi1<B1><14:0> by adding the weight 100b to the bits<2:0> of the external start address ADDEX<14:0>.

A third adder 23 may generate the first preliminary column address ADDi1<B2><14:0> by adding a weight 010b to the external start address ADDEX<14:0>.

The third adder 23 may generate the first preliminary column address ADDi1<B2><14:0> by adding the weight 010b to the bits<2:0> of the external start address ADDEX<14:0>.

A fourth adder 24 may generate the first preliminary column address ADDi1<B3><14:0> by adding a weight 000b to the external start address ADDEX<14:0>.

The fourth adder 24 may generate the first preliminary column address ADDi1<B3><14:0> by adding the weight 000b to the bits<2:0> of the external start address ADDEX<14:0>.

The counting circuit 40 may generate the plurality of second preliminary column addresses ADDi2<B0:B3><14:0> by counting the plurality of first preliminary column addresses ADDi1<B0:B3><14:0> according to the plurality of counting clock signals CKCNT<B0:B3>.

The counting circuit 40 may include a plurality of counters 41 to 44.

A first counter 41 may vary, for example, increase a value of the second preliminary column address ADDi2<B0><14:0> by counting the first preliminary column address ADDi1<B0><14:0> according to the counting clock signal CKCNT<B0>.

A second counter 42 may vary, for example, increase a value of the second preliminary column address ADDi2<B1><14:0> by counting the first preliminary column address ADDi1<B1><14:0> according to the counting clock signal CKCNT<B1>.

A third counter 43 may vary, for example, increase a value of the second preliminary column address ADDi2<B2><14:0> by counting the first preliminary column address ADDi1<B2><14:0> according to the counting clock signal CKCNT<B2>.

A fourth counter 44 may vary, for example, increase a value of the second preliminary column address ADDi2<B3><14:0> by counting the first preliminary column address ADDi1<B3><14:0> according to the counting clock signal CKCNT<B3>.

The latch circuit 60 may generate the plurality of column addresses ADDC<B0:B3><14:0> by latching the plurality of second preliminary column addresses ADDi2<B0:B3><14:0> according to the plurality of latch clock signals CKLT<B0:B3>.

The latch circuit 60 may include a plurality of latches 61 to 64.

A first latch 61 may generate the column address ADDC<B0><14:0> by latching the second preliminary column address ADDi2<B0><14:0> according to the latch clock signal CKLT<B0>.

A second latch 62 may generate the column address ADDC<B1><14:0> by latching the second preliminary column address ADDi2<B1><14:0> according to the latch clock signal CKLT<B1>.

A third latch 63 may generate the column address ADDC<B2><14:0> by latching the second preliminary column address ADDi2<B2><14:0> according to the latch clock signal CKLT<B2>.

A fourth latch 64 may generate the column address ADDC<B3><14:0> by latching the second preliminary column address ADDi2<B3><14:0> according to the latch clock signal CKLT<B3>.

The clock signal generation circuit 80 may generate the plurality of counting clock signals CKCNT<B0:B3> and the plurality of latch clock signals CKLT<B0:B3> according to a clock signal (hereinafter, referred to as external clock signal) CLK provided from the outside of the semiconductor device 10, a first enable signal EN1, and a second enable signal EN2.

The column address ADDC<B0><14:0> may be provided to a first memory bank BK0 among the plurality of memory banks BK0 to BK3, the column address ADDC<B1><14:0> may be provided to a second memory bank BK1, the column address ADDC<B2><14:0> may be provided to a third memory bank BK2, and the column address ADDC<B3><14:0> may be provided to a fourth memory bank BK3.

First data input from the outside may be stored in memory cells of the first memory bank BK0 corresponding to the column address ADDC<B0><14:0>.

Second data input from the outside may be stored in memory cells of the second memory bank BK1 corresponding to the column address ADDC<B1><14:0>.

Third data input from the outside may be stored in memory cells of the third memory bank BK2 corresponding to the column address ADDC<B2><14:0>.

Fourth data input from the outside may be stored in memory cells of the fourth memory bank BK3 corresponding to the column address ADDC<B3><14:0>.

The first data, the second data, the third data, and the fourth data may be sequentially input from the outside to match an operation characteristic of the semiconductor device 10.

Figure 2:
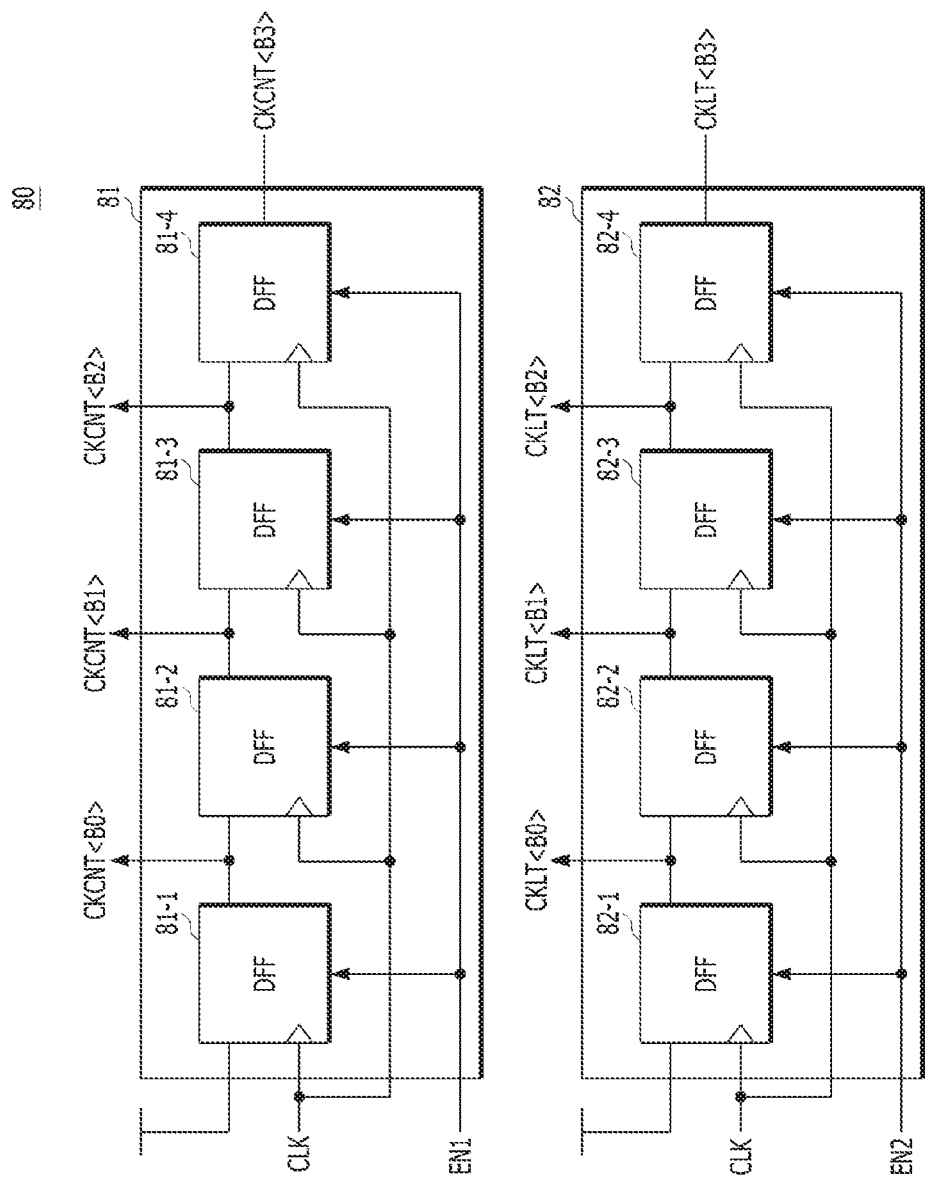
FIG. 2 is a diagram illustrating a configuration of a clock signal generation circuit of FIG. 1.

FIG. 2 is a diagram illustrating a configuration of the clock signal generation circuit of FIG. 1.

Referring to FIG. 2, the clock signal generation circuit 80 may include a counting clock signal generation circuit 81 and a latch clock signal generation circuit 82.

The counting clock signal generation circuit 81 may generate the plurality of counting clock signals CKCNT<B0:B3> according to a power voltage level, the external clock signal CLK, and the first enable signal EN1.

The counting clock signal generation circuit 81 may include a plurality of flip flops (DFFs) 81-1 to 81-4.

The plurality of flip flops 81-1 to 81-4 may commonly receive the external clock signal CLK and the first enable signal EN1.

The most leading flip flop 81-1 among the plurality of flip flops 81-1 to 81-4 may be configured to receive the power voltage level according to the external clock signal CLK and other flip flops 81-2 to 81-4 may be configured to receive outputs of previous stages of flip flops 81-1 to 81-3 according to the external clock signal CLK.

The plurality of flip flops 81-1 to 81-4 may sequentially shift the power voltage level at a rising edge of the external clock signal CLK to sequentially activate the plurality of counting clock signals CKCNT<B0:B3> during an activation period of the first enable signal EN1.

The latch clock signal generation circuit 82 may generate the plurality of latch clock signals CKLT<B0:B3> according to the power voltage level, the external clock signal CLK, and the second enable signal EN2.

The latch clock signal generation circuit 82 may include a plurality of flip flops 82-1 to 82-4.

The plurality of flip flops 82-1 to 82-4 may commonly receive the external clock signal CLK and the second enable signal EN2.

The most leading flip flop 82-1 among the plurality of flip flops 82-1 to 82-4 may be configured to receive the power voltage level according to the external clock signal CLK and other flip flops 82-2 to 82-4 may be configured to receive outputs of previous stages of flip flops 82-1 to 82-3 according to the external clock signal CLK.

The plurality of flip flops 82-1 to 82-4 may sequentially shift the power voltage level at the rising edge of the external clock signal CLK to sequentially activate the plurality of latch clock signals CKLT<B0:B3> during an activation period of the second enable signal EN2.

The first enable signal EN1 and the second enable signal EN2 may be independently generated to have activation timings and activation periods which match previously set latency in an active operation of the semiconductor device, for example, a read operation or a write operation.

The clock signal generation circuit 80 described with reference to FIG. 2 may be merely an example and may be implemented through various manners such as division of the external clock signal CLK.

Figure 3:
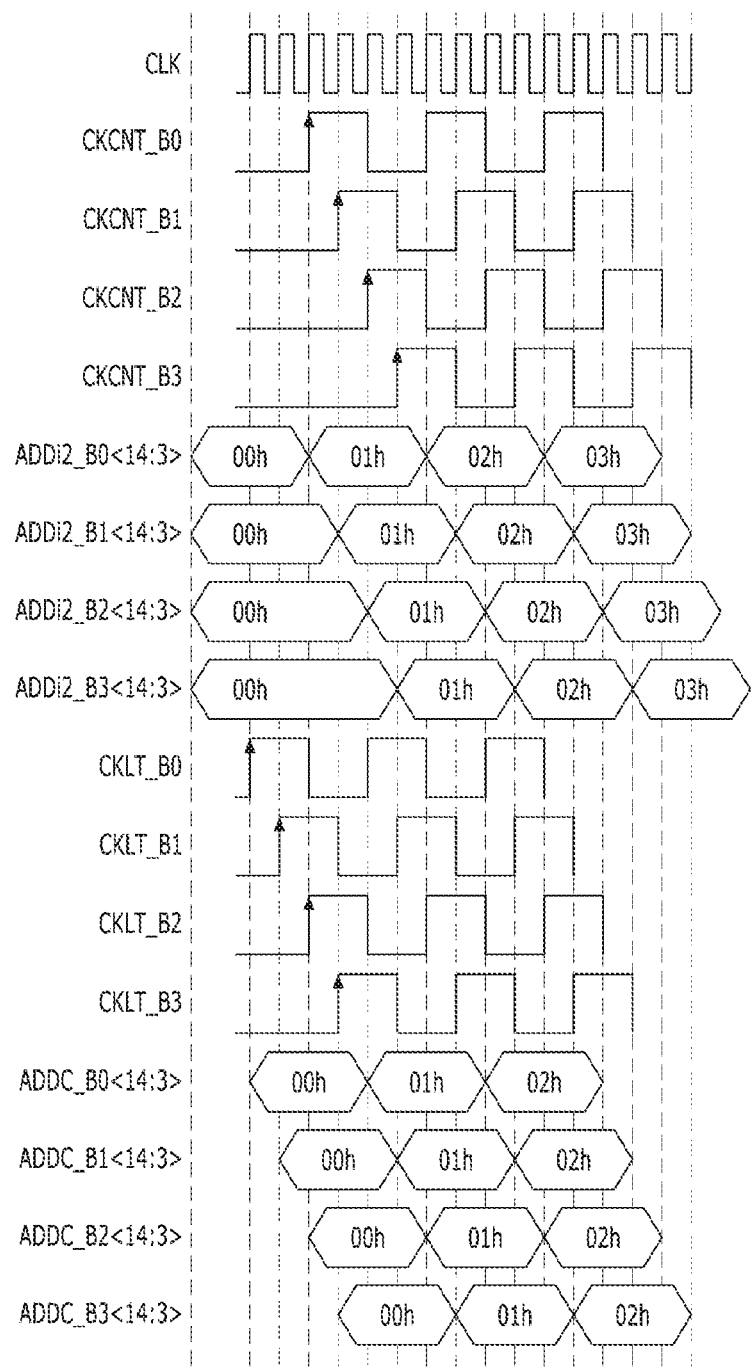
FIG. 3 is an operation timing diagram of an address counting circuit in a semiconductor device according to an embodiment of the present disclosure.

FIG. 3 is an operation timing diagram of an address counting circuit of a semiconductor device according to an embodiment.

Referring to FIGS. 1 to 3, the plurality of weights having different values may be added to bits<2:0> of the external start address ADDEX<14:0> to generate the plurality of first preliminary column addresses ADDi1<B0:B3><14:0>.

The initial values of addresses ADDi2<B0:B3><14:3> corresponding to a bit<14:3> among the plurality of second preliminary column addresses ADDi2<B0:B3><14:0> may have the same value as the external start address ADDEX<14:0>, for example, '00h'.

The plurality of second preliminary column addresses ADDi2<B0:B3><14:0> may be sequentially latched according to the plurality of latch clock signals CKLT<B0:B3> and may be provided to the plurality of memory banks BK0 to BK3 as the plurality of column addresses ADDC<B0:B3><14:0>.

The plurality of first preliminary column addresses ADDi1<B0:B3><14:0> having the initial values of '00h' may be sequentially counted according to the plurality of counting clock signals CKCNT<B0:B3> and values of the plurality of second preliminary column addresses ADDi2<B0:B3><14:0> may be increased in order of '01h', '02h', and '03h'.

As the values of the plurality of second preliminary column addresses ADDi2<B0:B3><14:0> are increased in order of '00h', '01h', and '02h', values of the plurality of column addresses ADDC<B0:B3><14:0> may be increased in order of '00h', '01h', and '02h' according to the plurality of latch clock signals CKLT<B0:B3> and provided to the plurality of memory banks BK0 to BK3.

Figure 4:
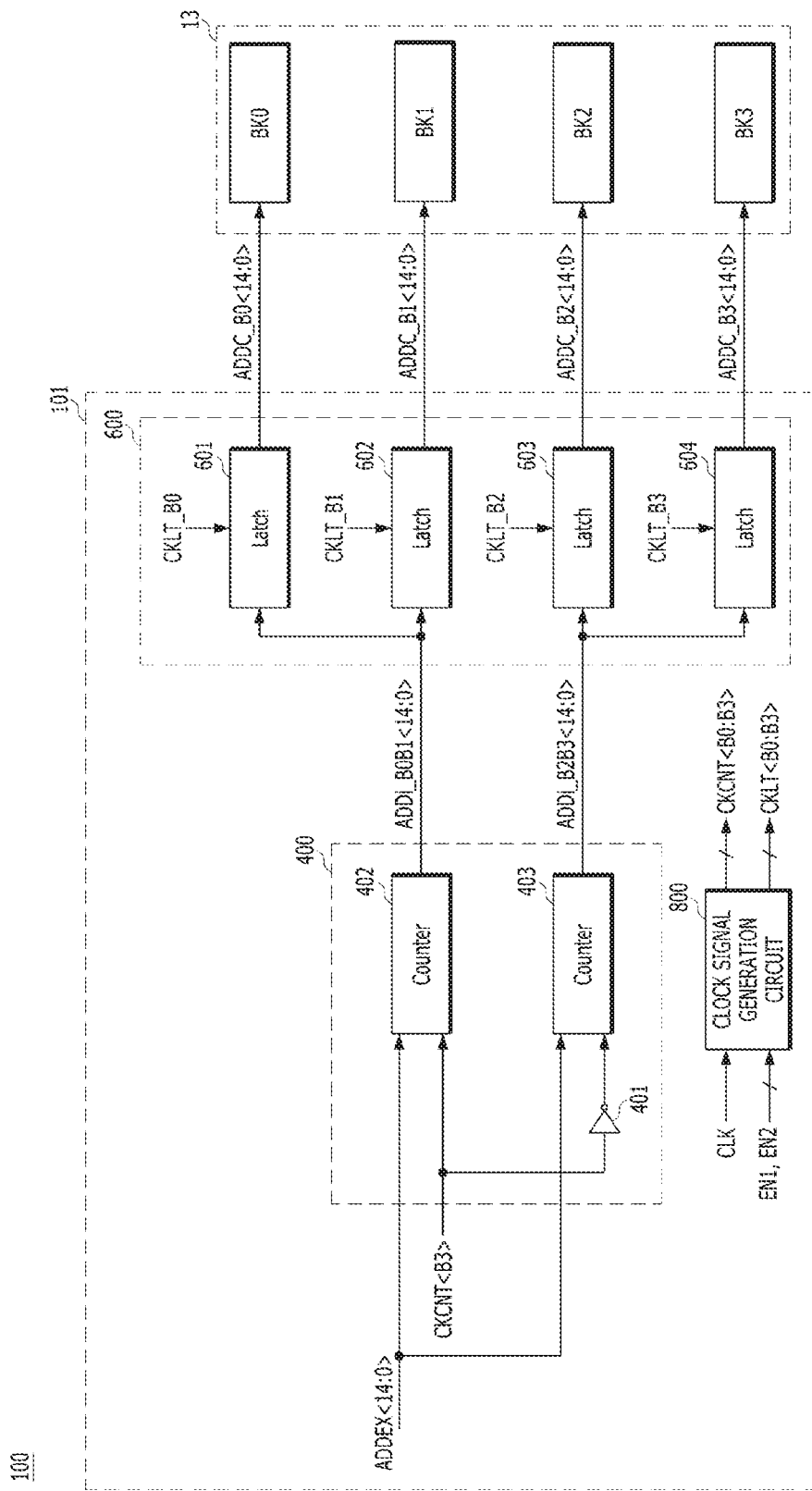
FIG. 4 is a diagram illustrating a configuration of a semiconductor device according to another embodiment of the present disclosure.

FIG. 4 is a diagram illustrating a configuration of a semiconductor device according to another embodiment.

Referring to FIG. 4, a semiconductor device 100 according to another embodiment may include an address counting circuit 101 and a memory region 13.

The memory region 13 may include a plurality of unit memory regions, for example, a plurality of memory banks BK0, BK1, BK2, and BK3.

Each of the plurality of memory banks BK0 to BK3 may include dynamic random access memory (DRAM) cells or NAND flash memory cells.

The address counting circuit 101 may generate the plurality of column addresses ADDC<B0:B3><14:0> by counting the external start address ADDEX<14:0> at a first edge and a second edge of the counting clock signal CKCNT<B3>.

The address counting circuit 101 may generate a first shared address ADDi_B0B1<14:0> and a second shared address ADDi_B2B3<14:0> by counting the external start address ADDEX<14:0> at the first edge and the second edge of the counting clock signal CKCNT<B3> and generate the plurality of column addresses ADDC<B0:B3><14:0> by latching the first shared address ADDi_B0B1<14:0> and the second shared address ADDi_B2B3<14:0> according to the plurality of latch clock signals CKLT<B0:B3>.

The example that the memory region 13 is configured of four memory banks and the address counting circuit 101 is also configured to generate the column addresses corresponding to the four memory banks has been illustrated in an embodiment, but the configuration of the address counting circuit 101 may also be changed according to the change in the configuration of the memory region 13.

The address counting circuit 101 may include a shared address counting circuit 400.

The address counting circuit 101 may further include a latch circuit 600 and a clock signal generation circuit 800.

The shared address counting circuit 400 may generate the first shared address ADDi_B0B1<14:0> and the second shared address ADDi_B2B3<14:0> by counting the external start address ADDEX<14:0> at the first edge and the second edge of the counting clock signal CKCNT<B3>.

The first edge and the second edge of the counting clock signal CKCNT<B3> may be a rising edge and a falling edge, respectively, of the counting clock signal CKCNT<B3>.

The shared address counting circuit 400 may include an inverter 401, the first counter 402, and a second counter 403.

The inverter 401 may invert the counting clock signal CKCNT<B3> and output an inverted counting clock signal.

The first counter 402 may vary a value of the first shared address ADDi_B0B1<14:0> by counting the external start address ADDEX<14:0> according to the counting clock signal CKCNT<B3>.

The first counter 402 may, for example, increase the value of the first shared address ADDi_B0B1<14:0> by counting the external start address ADDEX<14:0> at the rising edge of the counting clock signal CKCNT<B3>.

The second counter 403 may vary a value of the second shared address ADDi_B2B3<14:0> by counting the external start address ADDEX<14:0> according to an output signal of the inverter 401.

The second counter 403 may, for example, increase the value of the second shared address ADDi_B2B3<14:0> by counting the external start address ADDEX<14:0> according to a rising edge of the output signal of the inverter 401, for example, the falling edge of the counting clock signal CKCNT<B3>.

The latch circuit 600 may include a plurality of latches 601 to 604 which share the first shared address ADDi_B0B1<14:0> and the second shared address ADDi_B2B3<14:0>, respectively and generate the plurality of column addresses ADDC<B0:B3><14:0> by latching the first shared address ADDi_B0B1<14:0> and the second shared address ADDi_B2B3<14:0> according to the plurality of latch clock signals CKLT<B0:B3>.

The latch circuit 600 may generate partial column addresses ADDC<B0:B1><14:0> among the plurality of column addresses ADDC<B0:B3><14:0> by latching the first shared address ADDi_B0B1<14:0> according to partial latch clock signals CKLT<B0:B1> among the plurality of latch clock signals CKLT<B0:B3> and generate remaining column addresses ADDC<B2:B3><14:0> among the plurality of column addresses ADDC<B0:B3><14:0> by latching the second shared address ADDi_B2B3<14:0> according to remaining latch clock signals CKLT<B2:B3> among the plurality of latch clock signals CKLT<B0:B3>.

The latch circuit 600 may include the plurality of latches 601 to 604.

A first latch 601 may generate the column address ADDC<B0><14:0> by latching the first shared address ADDi_B0B1<14:0> according to the latch clock signal CKLT<B0>.

A second latch 602 may generate the column address ADDC<B1><14:0> by latching the first shared address ADDi_B0B1<14:0> according to the latch clock signal CKLT<B1>.

A third latch 603 may generate the column address ADDC<B2><14:0> by latching the second shared address ADDi_B2B3<14:0> according to the latch clock signal CKLT<B2>.

A fourth latch 604 may generate the column address ADDC<B3><14:0> by latching the second shared address ADDi_B2B3<14:0> according to the latch clock signal CKLT<B3>.

The clock signal generation circuit 800 may generate the plurality of counting clock signals CKCNT<B0:B3> and the plurality of latch clock signals CKLT<B0:B3> according to the external clock signal CLK, the first enable signal EN1, and the second enable signal EN2.

The column address ADDC<B0><14:0> may be provided to a first memory bank BK0 among the plurality of memory banks BK0 to BK3, the column address ADDC<B1><14:0> may be provided to a second memory bank BK1, the column address ADDC<B2><14:0> may be provided to a third memory bank BK2, and the column address ADDC<B3><14:0> may be provided to a fourth memory bank BK3.

First data input from the outside may be stored in memory cells of the first memory bank BK0 corresponding to the column address ADDC<B0><14:0>.

Second data input from the outside may be stored in memory cells of the second memory bank BK1 corresponding to the column address ADDC<B1><14:0>.

Third data input from the outside may be stored in memory cells of the third memory bank BK2 corresponding to the column address ADDC<B2><14:0>.

Fourth data input from the outside may be stored in memory cells of the fourth memory bank BK3 corresponding to the column address ADDC<B3><14:0>.

The first data, the second data, the third data, and the fourth data may be sequentially input from the outside to match an operation characteristic of the semiconductor device 100.

Figure 5:
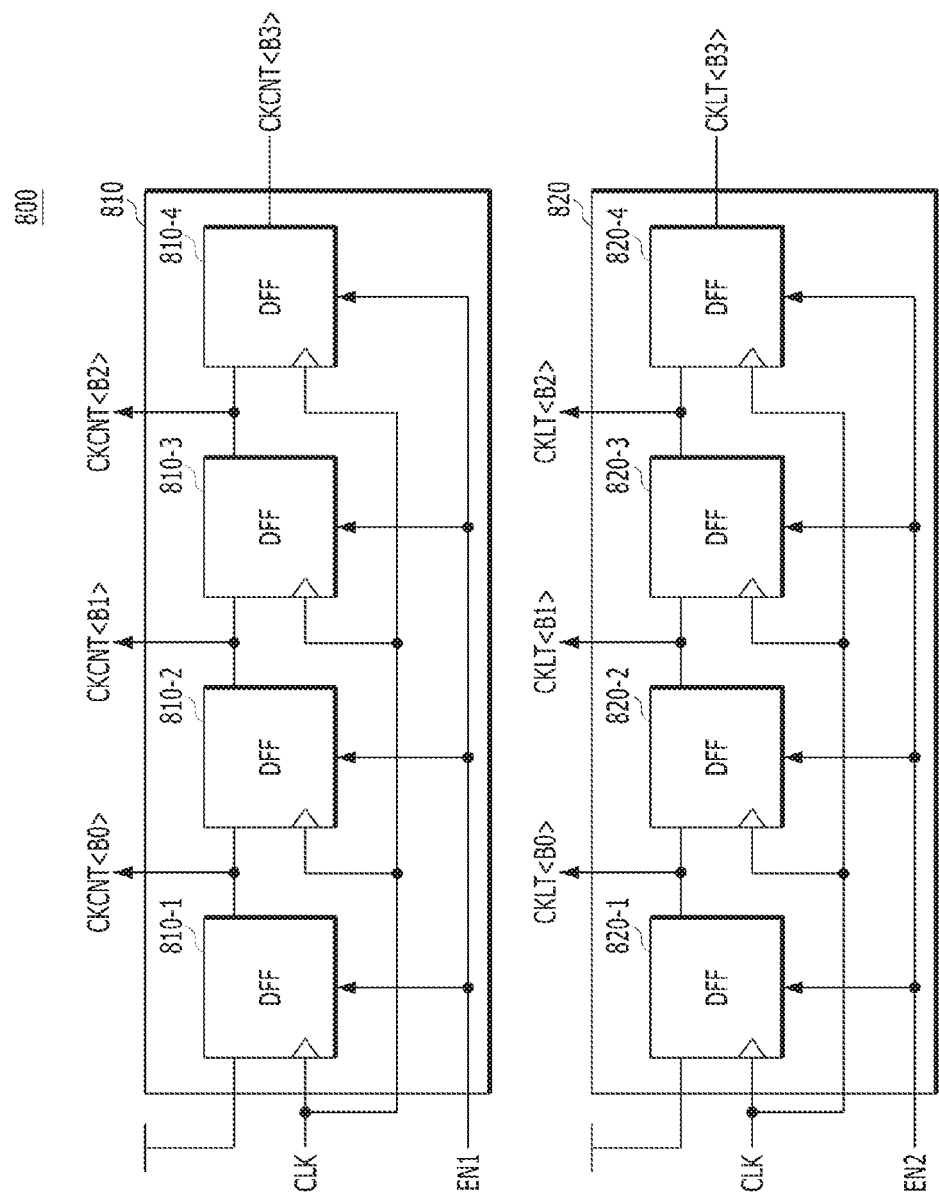
FIG. 5 is a diagram illustrating a configuration of a clock signal generation circuit of FIG. 4.

FIG. 5 is a diagram illustrating a configuration of the clock signal generation circuit of FIG. 4.

Referring to FIG. 5, the clock signal generation circuit 800 may include a counting clock signal generation circuit 810 and a latch clock signal generation circuit 820.

The counting clock signal generation circuit 810 may generate the plurality of counting clock signals CKCNT<B0:B3> according to the power voltage level, the external clock signal CLK, and the first enable signal EN1.

The counting clock signal generation circuit 810 may include a first flip flop group, for example, a plurality of flip flops (DFFs) 810-1 to 810-4.

The plurality of flip flops 810-1 to 810-4 may commonly receive the external clock signal CLK and the first enable signal EN1.

The most leading flip flop 810-1 among the plurality of flip flops 810-1 to 810-4 may be configured to receive the power voltage level according to the external clock signal CLK and other flip flops 810-2 to 810-4 may be configured to receive outputs of previous stages of flip flops 810-1 to 810-3 according to the external clock signal CLK.

The plurality of flip flops 810-1 to 810-4 may sequentially shift the power voltage level at the rising edge of the external clock signal CLK to sequentially activate the plurality of counting clock signals CKCNT<B0:B3> during the activation period of the first enable signal EN1.

Any one counting clock signal, for example, only the counting clock signal CKCNT<B3> among the plurality of counting clock signals CKCNT<B0:B3> may be used in these embodiments.

The latch clock signal generation circuit 820 may generate the plurality of latch clock signals CKLT<B0:B3> according to the power voltage level, the external clock signal CLK, and the second enable signal EN2.

The latch clock signal generation circuit 820 may include a second flip flop group, for example, a plurality of flip flops 820-1 to 820-4.

The plurality of flip flops 820-1 to 820-4 may commonly receive the external clock signal CLK and the second enable signal EN2.

The most leading flip flop 820-1 among the plurality of flip flops 820-1 to 820-4 may be configured to receive the power voltage level according to the external clock signal CLK and other flip flops 820-2 to 820-4 may be configured to receive outputs of previous stages of flip flops 820-1 to 820-3 according to the external clock signal CLK.

The plurality of flip flops 820-1 to 820-4 may sequentially shift the power voltage level according to the rising edge of the external clock signal CLK to sequentially activate the plurality of latch clock signals CKLT<B0:B3> during the activation period of the second enable signal EN2.

The first enable signal EN1 and the second enable signal EN2 may be independently generated to have activation timings and activation periods which match previously set latency in an active operation of the semiconductor device, for example, a read operation or a write operation.

In an embodiment, the first enable signal EN1 and the second enable signal EN2 may have the same activation timing and activation period as each other and thus the plurality of counting clock signals CKCNT<B0:B3> and the plurality of latch clock signals CKLT<B0:B3> may be transited at the same timing.

Figure 6:
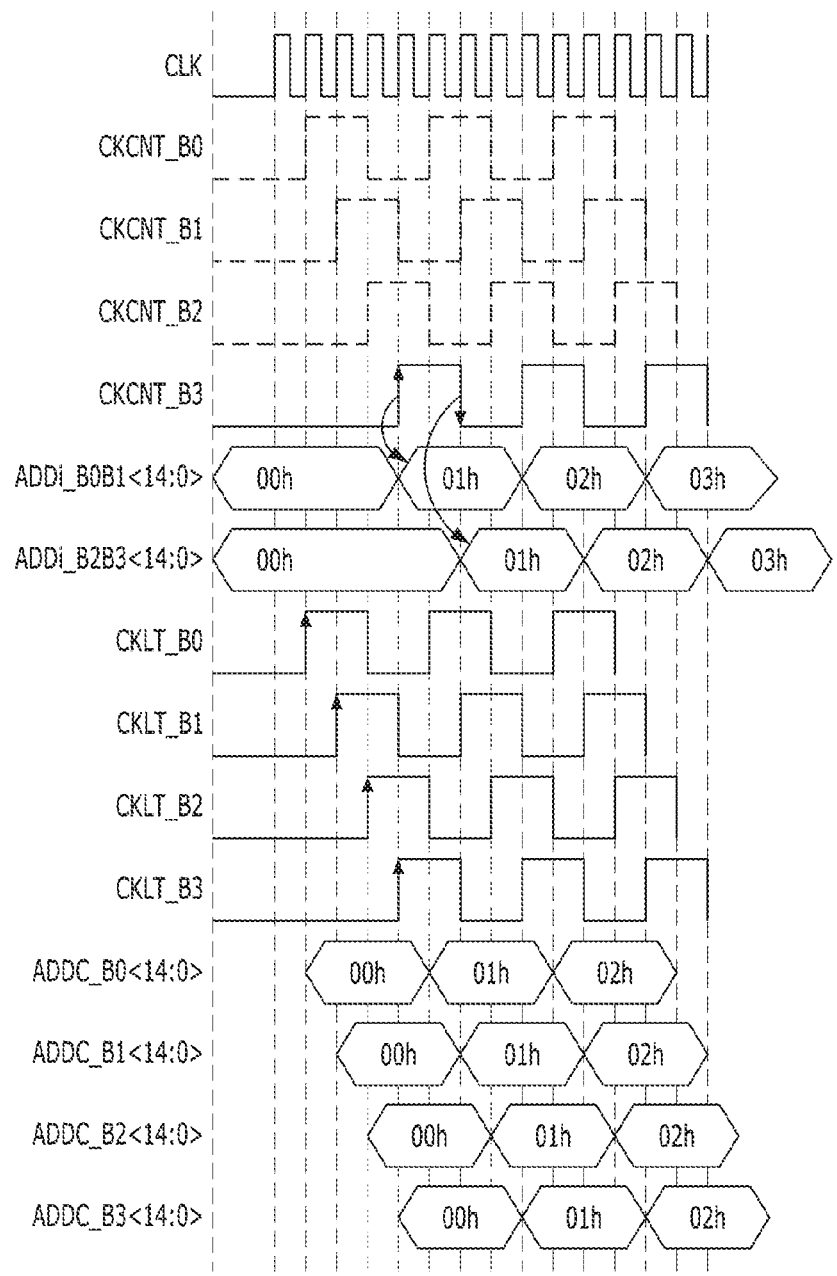
FIG. 6 is an operation timing diagram of an address counting circuit in a semiconductor device according to another embodiment of the present disclosure.

FIG. 6 is an operation timing diagram of an address counting circuit of a semiconductor device according to another embodiment.

Referring to FIGS. 4 to 6, the first shared address ADDi_B0B1<14:0> and the second shared address ADDi_B2B3<14:0> may be generated by counting the external start address ADDEX<14:0> at a rising edge and a falling edge of any one counting clock signal, for example, the counting clock signal CKCNT<B3> among the plurality of counting clock signals CKCNT<B0:B3>.

The first shared address ADDi_B0B1<14:0> and the second shared address ADDi_B2B3<14:0> may have the same value, for example, '00h' in an initial state, for example, before an initial rising edge of the counting clock signal CKCNT<B3>.

At the rising edge of the counting clock signal CKCNT<B3>, the value of the first shared address ADDi_B0B1<14:0> may be increased to '01h' and the value of the second shared address ADDi_B2B3<14:0> may be maintained as '00h'.

At the falling edge of the counting clock signal CKCNT<B3>, the value of the second shared address ADDi_B2B3<14:0> may be increased to '01h'.

Accordingly, the values of the first shared address ADDi_B0B1<14:0> and the second shared address ADDi_B2B3<14:0> may be increased in order of '02h' and '03h' with a time difference in the above-described manner.

In another embodiment, the first enable signal EN1 and the second enable signal EN2 may have the same activation timing and activation period as each other and thus the plurality of counting clock signals CKCNT<B0:B3> and the plurality of latch clock signals CKLT<B0:B3> may be transited with the same timing.

The first shared address ADDi_B0B1<14:0> may be sequentially latched according to the latch clock signals CKLT<B0> and CKLT<B1> among the plurality of latch clock signals CKLT<B0:B3> and thus the column addresses ADDC<B0><14:0> and ADDC<B1><14:0> among the plurality of column addresses ADDC<B0:B3><14:0> may be generated with a time difference.

The second shared address ADDi_B2B3<14:0> may be sequentially latched according to the latch clock signals CKLT<B2> and CKLT<B3> among the plurality of latch clock signals CKLT<B0:B3> and thus the column addresses ADDC<B2><14:0> and ADDC<B3><14:0> among the plurality of column addresses ADDC<B0:B3><14:0> may be generated with a time difference.

As the values of the first shared address ADDi_B0B1<14:0> and the second shared address ADDi_B2B3<14:0> are increased with a time difference, the values of the plurality of column addresses ADDC<B0:B3><14:0> may be increased in order of '01h' and '02h' according to the plurality of latch clock signals CKLT<B0:B3> and provided to the plurality of memory banks BK0 to BK3.

The address counting circuit 11 described with reference to FIGS. 1 to 3 in an embodiment may include the first to fourth adders 21 to 24 configured to add the plurality of weights having different values to the external start address ADDEX<14:0>. Further, the address counting circuit 11 may include counters, for example, four counters 41 to 44 corresponding to the number of memory banks to generate the plurality of second preliminary column addresses ADDi2<B0:B3><14:0> by counting the plurality of first preliminary column addresses ADDi1<B0:B3><14:0> according to the plurality of counting clock signals CKCNT<B0:B3>.

The address counting circuit 101 described with reference to FIGS. 4 to 6 in another embodiment might not perform weight addition and thus the configuration corresponding to the first to fourth adders 21 to 24 of FIG. 1 may be omitted.

Further, the address counting circuit 101 may generate the plurality of column addresses ADDC<B0:B3><14:0>, which are provided to the plurality of memory banks BK0 to BK3 with a time difference, only using the first shared address ADDi_B0B1<14:0> shared by the memory banks BK0 and BK1 among the plurality of memory banks BK0 to BK3 and the second shared address ADDi_B2B3<14:0> shared by the memory banks BK2 and BK3 and thus only two counters 402 and 403 smaller than the number of memory banks BK0 to BK3 may be necessary.

As described above, the semiconductor device 100 according to another embodiment may reduce the circuit dimension as compared with the semiconductor device 10 of FIG. 1.

Although the address counting circuits may be implemented based on four unit memory regions, for example, four memory banks in the semiconductor devices of FIGS. 1 and 4, the reduction width of the circuit dimension may be increased as the number of unit memory regions is increased.

The above described embodiments of the present disclosure are intended to illustrate and not to limit the present disclosure. Various alternatives and equivalents are possible. The embodiments are not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. An address counting circuit comprising:
a shared address counting circuit configured to input an external start address only once and configured to vary a value of a first shared address and a second shared address by outputting results of repeatedly counting the external start address according to a counting clock signal as the first shared address and the second shared address; and
a latch circuit including a plurality of latches configured to share the first shared address and the second shared address, respectively and generate a plurality of column addresses by latching the first shared address and the second shared address according to a plurality of latch clock signals.

2. The address counting circuit of claim 1, wherein the shared address counting circuit includes:
   a first counter configured to vary the value of the first shared address by counting the external start address according to a first edge of the counting clock signal; and
   a second counter configured to vary the value of the second shared address by counting the external start address according to a second edge of the counting clock signal.

3. The address counting circuit of claim 2,
   wherein a first group comprising at least two latches from the plurality of latches shares the first shared address received from the first counter, and
   wherein a second group comprising at least two latches from the plurality of latches shares the second shared address received from the second counter, the at least two latches of the second group different from the at least two latches of the first group.

4. The address counting circuit of claim 1, wherein the shared address counting circuit includes:
   an inverter configured to invert the counting clock signal and output an inverted counting clock signal;
   a first counter configured to vary a value of the first shared address by counting the external start address according to the counting clock signal; and
   a second counter configured to vary a value of the second shared address by counting the external start address according to an output of the inverter.

5. The address counting circuit of claim 1, wherein the latch circuit is configured to generate partial column addresses among the plurality of column addresses by latching the first shared address according to partial latch clock signals among the plurality of latch clock signals, and generate remaining column addresses among the plurality of column addresses by latching the second shared address according to remaining latch clock signals among the plurality of latch clock signals.

6. The address counting circuit of claim 1, further comprising a clock signal generation circuit configured to generate a plurality of counting clock signals and the plurality of latch clock signals according to an external clock signal and at least one enable signal.

7. The address counting circuit of claim 6, wherein any one of the plurality of counting clock signals is used as the counting clock signal.

8. The address counting circuit of claim 6, wherein the clock signal generation circuit includes:
   a counting clock signal generation circuit configured to generate the plurality of counting clock signals according to a power voltage level, the external clock signal, and a first enable signal; and
   a latch clock signal generation circuit configured to generate the plurality of latch clock signals according to the power voltage level, the external clock signal, and a second enable signal.

9. The address counting circuit of claim 6, wherein the clock signal generation circuit includes:
   a first flip flop group configured to sequentially activate the plurality of counting clock signals by sequentially shifting the power voltage level at a rising edge of the external clock signal during an activation period of the first enable signal; and
   a second flip flop group configured to sequentially activate the plurality of latch clock signals by sequentially shifting the power voltage level at the rising edge of the external clock signal during an activation period of the second enable signal.

10. A semiconductor device comprising:
    a memory region including a plurality of unit memory regions; and
    an address counting circuit configured to input an external start address only once and configured to vary a value of a first shared address and a second shared address by outputting results of repeatedly counting the external start address according to a counting clock signal as the first shared address and the second shared address and generate a plurality of column addresses corresponding to the plurality of unit memory regions by latching the first shared address and the second shared address according to a plurality of latch clock signals.

11. The semiconductor device of claim 10, wherein the address counting circuit includes:
    a shared address counting circuit configured to vary the value of the first shared address and the second shared address by counting the external start address at a first edge and a second edge of the counting clock signal; and
    a latch circuit including a plurality of latches configure to share the first shared address and the second shared address, respectively and generate the plurality of column addresses by latching the first shared address and the second shared address according to the plurality of latch clock signals.

12. The semiconductor device of claim 11,
    wherein a first group comprising at least two latches from the plurality of latches shares the first shared address received from the first counter, and
    wherein a second group comprising at least two latches from the plurality of latches shares the second shared address received from the second counter, the at least two latches of the second group different from the at least two latches of the first group.

13. The semiconductor device of claim 11, wherein the shared address counting circuit includes:
    an inverter configured to invert the counting clock signal and output an inverted counting clock signal;
    a first counter configured to vary a value of the first shared address by counting the external start address according to the counting clock signal; and
    a second counter configured to vary a value of the second shared address by counting the external start address according to an output of the inverter.

14. The semiconductor device of claim 11, wherein the latch circuit is configured to generate partial column addresses among the plurality of column addresses by latching the first shared address according to partial latch clock signals among the plurality of latch clock signals, and generate remaining column addresses among the plurality of column addresses by latching the second shared address according to remaining latch clock signals among the plurality of latch clock signals.

15. The semiconductor device of claim 11, further comprising a clock signal generation circuit configured to generate a plurality of counting clock signals and the plurality of latch clock signals according to an external clock signal and at least one enable signal.

16. The semiconductor device of claim 15, wherein any one of the plurality of counting clock signals is used as the counting clock signal.

17. The semiconductor device of claim 15, wherein the clock signal generation circuit includes:
- a counting clock signal generation circuit configured to generate the plurality of counting clock signals according to a power voltage level, the external clock signal, and a first enable signal; and
- a latch clock signal generation circuit configured to generate the plurality of latch clock signals according to the power voltage level, the external clock signal, and a second enable signal.

18. The semiconductor device of claim 11, wherein the clock signal generation circuit includes:
- a first flip flop group configured to sequentially activate the plurality of counting clock signals by sequentially shifting the power voltage level at a rising edge of the external clock signal during an activation period of the first enable signal; and
- a second flip flop group configured to sequentially activate the plurality of latch clock signals by sequentially shifting the power voltage level at the rising edge of the external clock signal during an activation period of the second enable signal.

19. Semiconductor device of claim 10, wherein the shared address counting circuit includes:
- a first counter configured to vary the value of the first shared address by counting the external start address according to a first edge of the counting clock signal; and
- a second counter configured to vary the value of the second shared address by counting the external start address according to a second edge of the counting clock signal.

20. The semiconductor device of claim 10, wherein the memory region includes NAND flash memory cells.

* * * * *